(12) United States Patent
Zhen et al.

(10) Patent No.: US 11,839,886 B2
(45) Date of Patent: Dec. 12, 2023

(54) LIQUID GUIDING COMPONENT AND USING METHOD AND APPLICATION THEREOF

(71) Applicant: Najing Technology Corporation Limited, Zhejiang (CN)

(72) Inventors: Changgua Zhen, Zhejiang (CN); Xinyan Gu, Zhejiang (CN); Junjun Peng, Zhejiang (CN)

(73) Assignee: Najing Technology Corporation Limited, Zhejiang (CN)

( * ) Notice: Subject to any disclaimer, the term of this patent is extended or adjusted under 35 U.S.C. 154(b) by 749 days.

(21) Appl. No.: 16/652,066

(22) PCT Filed: Sep. 28, 2018

(86) PCT No.: PCT/CN2018/108305
§ 371 (c)(1),
(2) Date: Mar. 29, 2020

(87) PCT Pub. No.: WO2019/072102
PCT Pub. Date: Apr. 18, 2019

(65) Prior Publication Data
US 2020/0246810 A1  Aug. 6, 2020

(30) Foreign Application Priority Data
Oct. 13, 2017  (CN) .......................... 201710953212.5

(51) Int. Cl.
*B05B 1/02* (2006.01)
*B41J 2/175* (2006.01)
(Continued)

(52) U.S. Cl.
CPC .............. *B05B 1/02* (2013.01); *H01L 33/005* (2013.01); *H10K 71/00* (2023.02); *H10K 71/135* (2023.02); *B41J 2/175* (2013.01); *B41J 2/17553* (2013.01); *B41J 2002/14467* (2013.01); *H01L 2933/0025* (2013.01)

(58) Field of Classification Search
CPC . B05B 1/02; H01L 33/005; H01L 2933/0025; H10K 71/00; H10K 71/135;
(Continued)

(56) References Cited

U.S. PATENT DOCUMENTS 9,303,317 B2    4/2016  Jeong
2008/0236425 A1*  10/2008  Takamatsu ........... H05K 3/1275
                                                       101/463.1
(Continued)

FOREIGN PATENT DOCUMENTS

CN    102529376 A    7/2012
CN    103208508 A    7/2013
(Continued)

OTHER PUBLICATIONS

CN106696501A, machine translation. (Year: 2017).*

*Primary Examiner* — Yaovi M Ameh
(74) *Attorney, Agent, or Firm* — Gang Yu

(57) ABSTRACT

The present disclosure provides a liquid guiding component and a using method and application thereof. The liquid guiding component includes a plurality of liquid guiding grooves, each of which includes at least one inlet end, at least one outlet end, and a groove wall connecting the inlet end and the outlet end, the liquid guiding component includes a first side and a second side arranged opposite to each other, each of said inlet ends is arranged as liquid inlet on the first side and each of the outlet ends is arranged as the liquid outlet on the second side, and the liquid guiding grooves are used to transport liquid from the inlet ends to the outlet ends. The liquid guiding component can be used to precisely control the movement direction of the ejected ink.

18 Claims, 4 Drawing Sheets

(51) Int. Cl.
   *H01L 33/00*      (2010.01)
   *H10K 71/00*      (2023.01)
   *H10K 71/13*      (2023.01)
   *B41J 2/14*       (2006.01)

(58) Field of Classification Search
   CPC .................. B41J 2/175; B41J 2/17553; B41J 2002/14467
   See application file for complete search history.

(56) References Cited

U.S. PATENT DOCUMENTS

2013/0240870 A1* 9/2013 Kawato ................ C23C 14/243
                                                    438/46
2014/0033980 A1   2/2014 Jeong

FOREIGN PATENT DOCUMENTS

| | | | |
|---|---|---|---|
| CN | 104369541 A | 2/2015 | |
| CN | 205705757 U | 9/2016 | |
| CN | 106158916 A | 11/2016 | |
| CN | 106252528 A | 12/2016 | |
| CN | 106696501 A * | 5/2017 | ............. B41M 5/00 |
| CN | 106696501 A | 5/2017 | |
| CN | 107745581 A | 3/2018 | |
| EP | 1418250 A2 | 5/2004 | |
| IN | 107230697 A | 10/2017 | |
| JP | 2007276443 A | 10/2007 | |
| JP | 2013154531 A * | 8/2013 | ............... B41J 2/01 |
| JP | 2016513003 A | 5/2016 | |

* cited by examiner

LIQUID GUIDING COMPONENT AND USING METHOD AND APPLICATION THEREOF

CROSS-REFERENCE TO RELATED APPLICATIONS

This application is a national phase entry under 35 U.S.C. § 371 of International Patent Application PCT/CN2018/108305, filed Sep. 28, 2018, designating the United States of America and published as International Patent Publication WO 2019/072102 A1 on Apr. 18, 2019, which claims the benefit under Article 8 of the Patent Cooperation Treaty to Chinese Patent Application Serial No. 201710953212.5, filed on Oct. 13, 2017, the disclosure of which is hereby incorporated herein in its entirety by this reference.

TECHNICAL FIELD

The present disclosure relates to the field of inkjet printing technology, in particular to a liquid guiding component and a using method and application thereof.

BACKGROUND

Inkjet printing is an important art for the production of display devices such as Organic Light-Emitting Diode (OLED) or Quantum Dot Light Emitting Diode (QLED). In the inkjet printing method, an inkjet printing device is used to print ink onto a substrate or a pixel pit on a substrate, and the ink is dried to form a film, thereby preparing a display device having a multi-film structure, which is simple in operation and conducive to mass production. However, in recent years, the fineness and quality requirements for imaging of display devices have become higher and higher, and existing inkjet printing devices cannot meet the aforesaid requirements due to difficulty in performance improvement. For example, the problem of cross contamination of light between adjacent pixels or pixel absence often occurs in actual production, which seriously restricts the development of display devices. Therefore, there is a need for an inkjet printing device with high printing accuracy.

SUMMARY

A main object of the present disclosure is to provide a liquid guiding component and a using method and application thereof to solve the problem that the display device produced by the inkjet printing device is prone to have cross contamination of light between adjacent pixels or pixel absence in the prior art.

To realize the above object, according to one aspect of the present disclosure, a liquid guiding component includes a plurality of liquid guiding grooves, each of the liquid guiding grooves including at least one inlet end, at least one outlet end, as well as a groove wall connecting the inlet end and the outlet end, wherein, the liquid guiding component includes a first side and a second side arranged opposite to each other, each of the inlet ends is arranged as liquid inlet on the first side and each of the outlet ends is arranged as liquid outlet on the second side, and the liquid guiding groove is used to transport liquid from the inlet end to the outlet end.

Further, the groove wall includes an inner surface, the inner surface including at least one section of downhill surface, preferably the downhill surface is an inclined surface.

Further, the inner surface is a concave inner surface.

Further, the inner surface is a wrap-around surface, the inlet end and the outlet end respectively forming an opening of inlet end and an opening of outlet end, the inner surface connecting the opening of inlet end and the opening of outlet end, the area of the opening of inlet end being greater than the area of the opening of outlet end, and preferably, the inner surface of the groove wall including a conical inclined surface.

Further, the inner surface of the groove walls near the outlet end further includes at least one section of vertical surface, and preferably, the vertical surface includes a cylindrical vertical surface.

Further, when the liquid guiding component is used together with an inkjet printing device for inkjet printing, the verticality of the vertical surface is not worse than the jet straightness of the liquid ejected from the nozzle orifice of the inkjet printing device.

Further, the inlets end of the liquid guiding grooves are located in the same plane, and preferably, the outlet ends are located in the same plane.

Further, the shortest distance between edges of two adjacent the liquid guiding grooves along the arrangement direction of the liquid guiding grooves is less than or equal to a preset distance, and preferably, the preset distance is 0~2 microns.

Further, each of the liquid guiding grooves is arranged in an array structure of rows and columns or a single row structure or a single column structure.

Further, an arrangement density of the liquid guiding grooves is 30~300 grooves per inch, preferably 100~300 grooves per inch.

Further, the surface energy of all or part of the inner surface of the groove walls is less than or equal to 20 dyn/cm, and preferably, the material forming the groove wall or the material of a film on the inner surface of the groove wall includes one or more of a fluorine-containing compound and an organosilicone.

Further, the inner surface of the groove wall is a superhydrophobic surface.

Further, the liquid guiding component is provided with an alignment mark.

According to a further aspect of the present disclosure, there is provided a using method of a liquid guiding component, wherein the liquid guiding component, a printing device and a target substrate to be printed are combined for inkjet printing, the liquid guiding component is configured between the printing device and the target substrate to be printed, the liquid guiding component being any one aforesaid liquid guiding component, wherein, the printing device has a plurality of nozzle orifices, and the liquid guiding component is used to receive ink ejected from the nozzle orifice through the inlet end, while the ink is discharged from the outlet end to the target substrate.

Further, the liquid guiding groove of the liquid guiding component are arranged in an array structure of rows and columns, and the using method includes: preparing the printing device, the liquid guiding component and the target substrate, wherein, the target substrate has a plurality of sub-pixel pits, and preferably, a plurality of the nozzle orifices are arranged in a single row structure or a single column structure; disposing the liquid guiding component above one side having the sub-pixel pits of the target substrate, the liquid guiding component covering a first part of or entire target substrate so that each of the outlet ends is aligned with each of first target sub-pixel pits of the target substrate one by one; controlling the relative movement between a print head and the liquid guiding component while the liquid guiding component is stationary relative to the target substrate, ejecting a first ink when each of the nozzle orifices passes over the corresponding inlet end, the first ink entering the first target sub-pixel pits via each of the liquid guiding grooves.

Further, when the liquid guiding component covers the first part of the target substrate, after the first ink is printed into the first target sub-pixel pits, the using method further includes: disposing the liquid guiding component above the side having the sub-pixel pits of the target substrate, the liquid guiding component covering a second part of the target substrate so that each of the outlet ends is aligned with each of the first target sub-pixel pits of the second part of the target substrate one by one, and repeating the step of controlling the movement to make the first ink enter the first target sub-pixel pits.

Further, each of the outlet ends is arranged in a single row structure or a single column structure, and the using method includes: preparing the printing device, the liquid guiding component and the target substrate, wherein, the target substrate has a plurality of sub-pixel pits, and a plurality of the nozzle orifices are arranged in a single row structure or a single column structure; adjusting the relative position of the liquid guiding component and a print head, so that each of the inlet ends is aligned with each of the nozzle orifices one by one, preferably the liquid guiding component is detachably connected with the print head; controlling the relative movement between the print head and the target substrate while the liquid guiding component is stationary relative to the print head, ejecting a first ink when each of the outlet ends passes over the corresponding first target sub-pixel pits, the first ink entering each of the first target sub-pixel pits via each of the liquid guiding grooves.

Further, a surface of one side of the target substrate has a plurality of pixel units, each of the pixel units including a plurality of adjacent sub-pixel pits in the same row or the same column, the orthographic projection of the inner edge line of each of outlet ends of the liquid guiding component on the target substrate being located in one target sub-pixel pit, the orthographic projection of the outer edge line of each of the inlet ends of the liquid guiding component on the target substrate being located in one of the pixel units.

Further, when the ink is ejected to the target sub-pixel pit, the distance between each of the outlet ends and corresponding the sub-pixel pit is controlled to be greater than or equal to the height of a pixel isolation structure.

Further, when the ink is ejected to the target sub-pixel pit, the distance between each of the outlet ends and corresponding the sub-pixel pit is controlled to be less than or equal to h/n, wherein, h is the distance between the nozzle orifice and the corresponding the sub-pixel pit, and n is an integer greater than 1, preferably n is greater than or equal to the number of the sub-pixel pits in one pixel unit; more preferably, the distance between each of the outlet ends and the corresponding the sub-pixel pit is controlled to be less than or equal to the product of h/n and the aperture ratio.

Further, each of the sub-pixel pits includes a plurality of sets of target sub-pixel pits, and each set of the target sub-pixel pits is arranged in the following structure: an array structure of rows and columns, a single row structure or a single column structure; after printing the first ink in the first target sub-pixel pits, the using method further includes: resetting a set of the target sub-pixel pit to be printed as a second target sub-pixel pits, replacing the first ink with a second ink, and replacing the liquid guiding component for a new one which corresponds to the second ink, repeating the step of disposing and the step of controlling the movement, so that the second ink is transported through the liquid guiding component to the second target sub-pixel pits until each set of the target sub-pixel pits of the target substrate is printed.

According to a further aspect of the present disclosure, there is also provided an inkjet printing component, including: a print head, the print head having a plurality of nozzle orifices, preferably the print head including at least one ink tank and a nozzle plate arranged under the ink tank; the liquid guiding component being any one of aforesaid liquid guiding components, the liquid guiding component including at least one liquid guiding groove disposed under the nozzle plate, each of liquid guiding grooves having at least one inlet end, at least one outlet end, and a groove wall connecting the inlet end and the outlet end, wherein, the inlet end is disposed opposite to at least one nozzle orifice as an inlet of ink ejected by the nozzle orifice, the outlet end is disposed below the inlet end as an outlet of the ink.

Further, the liquid guiding grooves are plural, each of the liquid guiding grooves independently including one inlet end and one outlet end, with each of the inlet ends corresponding to each of the outlet ends one by one, and preferably each of the nozzle orifices is aligned with each inlet end.

Further, the liquid guiding component is detachably connected with the nozzle plate.

According to a further aspect of the present disclosure, there is also provided an inkjet printing device, including aforesaid inkjet printing component.

According to a further aspect of the present disclosure, there is also provided an inkjet printing system, including aforesaid inkjet printing device and a target substrate to be printed, the inkjet printing device further including a motion unit for moving the inkjet printing component relative to the target substrate.

According to a further aspect of the present disclosure, there is also provided an optoelectronic device, wherein the optoelectronic device includes one or more of film layers, at least one of the film layers being prepared according to any one aforesaid using method of liquid guiding component.

According to a further aspect of the present disclosure, there is also provided an optical device, wherein the optical device includes one or more of film layers, at least one of the film layers being prepared according to any one aforesaid using method of liquid guiding component.

According to a further aspect of the present disclosure, there is also provided a display, wherein the display includes aforesaid optoelectronic device, the optoelectronic device being an electroluminescent diode, or the display includes aforesaid optical device.

According to the technical solution of the present disclosure, the present disclosure provides a liquid guiding component and a using method and applications thereof. The plurality of liquid guiding grooves 10 of the liquid guiding component can allow liquid to enter into the inlet end 101 and then flow out from the outlet end 103, and the groove wall 102 connecting the inlet end 101 and the outlet end 103 can play the role of transporting the liquid, thus preventing the flow direction of the liquid from deviating away from the outlet end 103. The liquid guiding component can be used in the inkjet printing, and the aforesaid liquid can be ink ejected by inkjet printing process. Use of liquid guiding component can accurately control the movement direction of the ejected ink and improve the accuracy of the inkjet printing, thereby avoiding the phenomenon of printing deviation caused by external adverse effects on the ink out of the nozzle orifice and low precision of the printing device itself, thus solving the problem of cross contamination of light of adjacent pixels or pixel absence occurring in the display device produced by inkjet printing in the prior art, and achieving the higher printing accuracy of inkjet printing, in comparison with the existing inkjet technology in which the ink is directly ejected from the nozzle orifice.

BRIEF DESCRIPTION OF THE DRAWINGS

The accompanying figures of the specification that form part of the application are used to provide a further understanding of the present disclosure, and the illustrative embodiments of the present disclosure and the description thereof are intended to explain the present disclosure and are not intended to limit the present disclosure. In the figures.

REFERENCE NUMERAL

Figure 1:
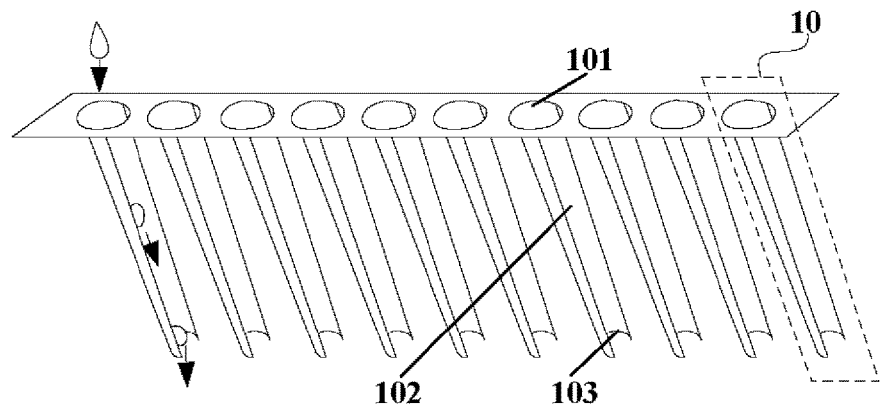
FIG. 1 shows a schematic diagram of an optional liquid guiding component provided by the present disclosure.

1. Liquid guiding component; 10. Liquid guiding groove; 101. Inlet end; 102. Groove wall; 103. Outlet end; 2. Printing device; 20. Nozzle orifice; 3. Target substrate; 30. Sub-pixel pit; 31. Pixel unit; 301. First target sub-pixel pit.

DETAILED DESCRIPTION

It should be noted that embodiments of the present disclosure and features of embodiments may be combined with each other without conflict. The present disclosure is described in detail with reference to the accompanying figures and in conjunction with embodiments.

In order to enable a person skilled in the art to better understand the solution of the present disclosure, the technical solutions in the embodiments of the present disclosure will be clearly and completely described below in conjunction with the accompanying figures in the embodiments of the present disclosure. Obviously, the described embodiments are merely a part of the embodiments of the disclosure, and not all of the embodiments. All other embodiments obtained by those skilled in the art based on the embodiments of the present disclosure without creative efforts shall fall within the scope of the present disclosure.

It should be noted that the terms "first" and "second" in the specification and claims of the present disclosure and the aforesaid accompanying figures are used to distinguish similar objects, and need not be used to describe specific order or sequence. It should be understood that the data so used may be interchangeable where appropriate to facilitate the description of embodiments of the disclosure disclosed herein. In addition, the term "include" and "have" as well as any variants thereof, are intended to cover a non-exclusive inclusion, for example, processes, methods, systems, products, or devices that include a series of steps or units are not necessarily limited to include those steps or units explicitly listed, and may include other steps or units not explicitly listed or inherent to such processes, methods, products or devices.

In the description of the embodiments, it shall be understood that when an area, a pattern, or a structure is said to be "above" or "below" another area or pattern, it may be "directly" or "indirectly" located on another area or pattern, or there may be one or more of intermediate structures. This position of the layer has been described with reference to the accompanying figures.

The thickness and dimensions of the components or structures shown in the accompanying figures may be exaggerated, omitted, or illustratively drawn for convenience or clarity. In addition, the dimensions of components or structures do not fully reflect their true dimensions.

As analyzed by the prior art of this application, the display device produced by inkjet printing in the prior art is prone to have cross contamination of light of adjacent pixels or pixel absence. In order to solve this problem, this application provides a liquid guiding component and a using method and applications thereof.

In an exemplary embodiment of the present application, a liquid guiding component is provided. As shown in FIGS. 1 to 4, the liquid guiding component includes a plurality of liquid guiding grooves 10, and each of the liquid guiding grooves 10 includes at least one inlet end 101, at least one outlet end 103, and a groove wall 102 connecting the inlet end 101 and the outlet end, wherein, the liquid guiding component includes a first side and a second side arranged opposite to each other, each of said inlet ends 101 is arranged as liquid inlet on the first side and each of said outlet ends 103 as the liquid outlet on the second side, and the liquid guiding groove is used to transport liquid from the inlet end 101 to the outlet end 103.

The flow direction of the liquid is also shown briefly in FIGS. 1 to 4, as shown by the droplets and arrows in FIGS. 1 to 4.

With the aforesaid embodiment of the present application, the plurality of liquid guiding grooves 10 of the liquid guiding component can allow liquid to enter into the inlet end 101 and then flow out from the outlet end 103, and the groove wall 102 connecting the inlet end 101 and the outlet end 103 can play the role of transporting the liquid, thus preventing the flow direction of the liquid from deviating away from the outlet end 103. The liquid guiding component can be used in the inkjet printing, and the aforesaid liquid can be ink ejected by inkjet printing process. Use of liquid guiding component can accurately control the movement direction of the ejected ink and improve the accuracy of the inkjet printing, thereby avoiding the phenomenon of printing deviation caused by external adverse effects on the ink out of the nozzle orifice and low precision of the printing device itself, thus solving the problem of cross contamination of light of adjacent pixels or pixel absence occurring in the display device produced by inkjet printing in the prior art, and achieving the higher printing accuracy of inkjet printing, in comparison with the existing inkjet technology in which the ink is directly ejected from the nozzle orifice.

The aforesaid liquid component with a relatively small size can be made, which can apply better in the inkjet printing process, and the outlet end of the liquid guiding component can match with the size and shape of the sub-pixel pit of the target substrate to be printed. In an optional embodiment, the inlet end of the liquid guiding component may be larger than the size of the aforesaid sub-pixel pit, and the outlet end may be close to or smaller than the size of the sub-pixel pit, under this condition, the size of the inlet end of the liquid guiding component is larger than the size of the outlet end. Thus, the nozzle orifice is more easily aligned with the larger inlet end, which is more advantageous for the inlet end to receive all of the ink ejected from the nozzle orifice, and the ink can accurately flow into the corresponding sub-pixel pit through the smaller outlet end, thereby improving the printing accuracy. Compared with the printing method in the prior art, use of the aforesaid liquid guiding component reduces the requirement for the printing accuracy in the vertical direction of the printing device, and achieves the purpose of realizing higher precision printing by using a printing device of relatively lower precision.

The composition of the aforesaid ink can include a luminescent material, a hole transport material, a hole injection material, an electron transport material, an electron injection material, an electrode material, and the like. The composition of the ink is not limited to the aforesaid materials, but also can include other suitable materials.

In some embodiments, the maximum dimension of each inlet end 101 (or cross section of inlet end 101) of the liquid guiding component in the width direction may be less than or equal to 846.7 microns; maximum dimension of each outlet end 103 (or cross section of outlet end 103) of the liquid guiding component in the width direction may be less than or equal to the width of inlet end 101, the opening area of outlet end 103 may be less than or equal to the opening area of inlet end 101, an average height of each liquid guiding groove 10 (in the vertical direction, that is, the direction which is perpendicular to the plane where the outlet end 103 is located, the average distance from the inlet end 101 to the outlet end 103 of the liquid guiding groove) may be less than or equal to 1 mm, preferably 0.4 mm. The aforesaid width direction may be as same as the orientation of each liquid guiding component. If the liquid guiding component is arranged in an array structure, the width direction may be the direction of row or column.

The liquid guiding groove of the aforesaid liquid guiding component may include various shapes realizing the transportation function. In an optional embodiment, the groove wall 102 of the liquid guiding component includes an inner surface, and the inner surface includes at least one section of downhill surface. When the liquid guiding component is in a state of working, the inlet end 101 is above the outlet end 103, the downhill surface is a downslope surface as viewed from the inlet end 101 toward the outlet end 103, and it may include at least a section of inclined surface. In some embodiments, the downhill surface is an inclined surface. The downhill surface causes the liquid to fall down under gravity.

Figure 2:
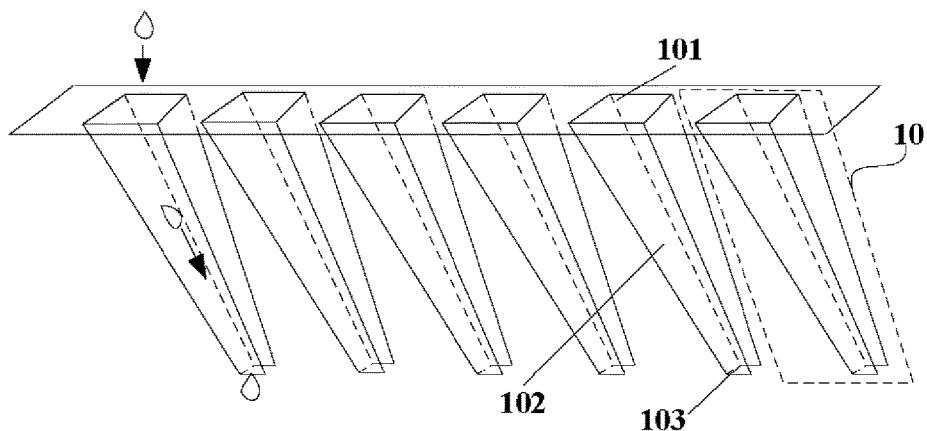
FIG. 2 shows a schematic diagram of another optional liquid guiding component provided by the present disclosure.

The inclined surface may be a smooth curved surface as shown in FIG. 1 or a shape formed by jointed three planes as shown in FIG. 2, and the inclined surfaces of the liquid guiding groove in the aforesaid FIG. 1 and FIG. 2 generally looks like the shape of "slide". The aforesaid inclined surface is not limited to the shapes in FIG. 1 and FIG. 2, and may be other shapes.

As shown in FIG. 1 and FIG. 2, the inner surface is the surface that can be in contact with the liquid among the surfaces of groove wall 102, which is a downhill surface and inclined surface. In FIG. 1 and FIG. 2, the inner surface of the groove wall 102 can be used to transport liquid coming from the inlet end 101; the liquid will move along the direction of the inclined inner surface until it flows out of the outlet end 103, so that the flow direction of the liquid can be precisely controlled which allows the liquid flowing out of the outlet end 103 to accurately flow into the target area, such as the sub-pixel pit of the target substrate. The angle between tangent of each point on the aforesaid inclined surface and the plane where the substrate is located (an acute angle between the plane where the substrate is located and the outer surface of the inclined surface) is an inclination angle; a larger the inclination angle is preferred, the larger the inclination angle is, the steeper the inclined plane is, for example, the larger inclination angle of the outlet end 103 can improve the accuracy of transporting liquid to the corresponding sub-pixel pit.

In some embodiments, the aforesaid inner surface is a concave inner surface, such as the inner surface that is concave along the direction from the inlet end 101 to the outlet end 103, thereby utilizing the concave shape to guide the movement of the liquid flowing inside the liquid guiding groove 10 and make the liquid flow more smoothly.

Figure 3:
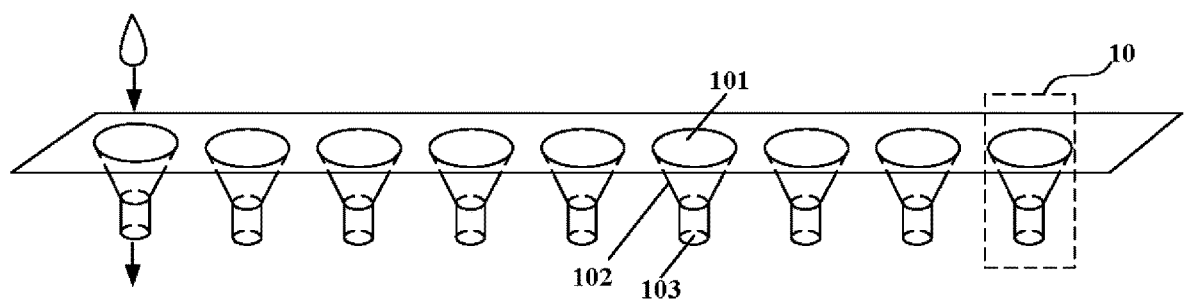
FIG. 3 shows a schematic diagram of a third optional liquid guiding component provided by the present disclosure.
Figure 4:
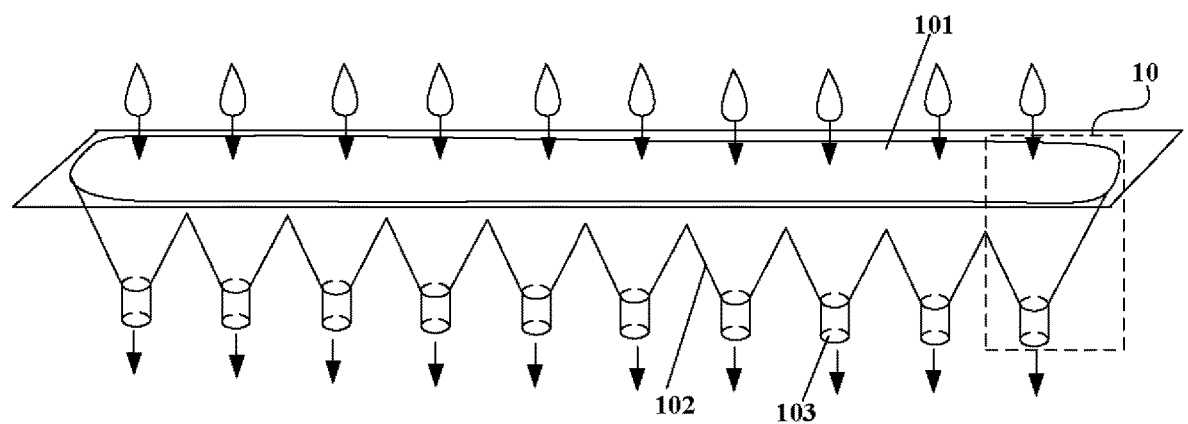
FIG. 4 shows a schematic diagram of a fourth optional liquid guiding component provided by the present disclosure.

The liquid guiding groove 10 may have other shapes besides the shapes as shown in FIG. 1 and FIG. 2, and in another optional embodiment, as shown in FIG. 3 and FIG. 4, the inner surface of the aforesaid groove wall 102 may also be a wrap-around surface, which may be understood as a hollow tube-like surface formed by curling a plane, while the aforesaid inlet end 101 and the aforesaid outlet end 103 also form an inlet end opening and an outlet end opening, respectively. The inner surface (i.e., the wrap-around surface) connects the inlet end and the outlet end, and the opening area of the inlet end is larger than the opening area of the outlet end, so that the liquid coming from the inlet end opening can be prevented from deviating from the preset running path to minimize the adverse effects of deviation factors on the liquid trajectory; and the opening area of the inlet end is larger than the opening area of the outlet end, making the liquid easier to enter the liquid guiding groove 10, and the opening area of the outlet end is relatively small, which can increase the controlling accuracy of the movement direction of the liquid after flowing out from the outlet end.

In some embodiments, the inner surface of the groove wall includes a conical inclined surface, which is also the shape of the upper half of groove wall 102 as shown in FIG. 3 and FIG. 4. The shape of the upper half is a frustum of a cone.

In addition to the aforesaid shape, the inner surface of the aforesaid groove wall 102 can further include at least one section of vertical surface near the outlet end, and preferably, the vertical surface includes a cylindrical vertical surface. The lower part of groove wall 102 near the outlet end 103 in FIG. 3 and FIG. 4 is the cylindrical vertical surface. In some embodiments, the aforesaid liquid guiding component can be used in inkjet printing in conjunction with an inkjet printing device, and the verticality of the aforesaid vertical surface (or the angle between the vertical surface and the vertical direction) is not less than the jet straightness of the liquid ejected from the nozzle orifice of the inkjet printing device, wherein the jet straightness is an angle relative to the vertical direction, and such vertical surface enables the liquid flow out more easily and a better direction control of the flow, in addition, the vertical surface can be more helpful for a quick and accurate alignment.

In order to facilitate the alignment of inkjet printing and massive production of the liquid guiding component, the inlet end 101 of each of aforesaid guiding grooves 10 above may be located in the same plane. In some embodiments, besides inlet end 101 of each guiding groove 10, each outlet end 103 may also be located in the same plane.

The inlet ends 101 in the same plane can be interconnected with each other or directly connected to each other through a connecting part. Likewise, the outlet ends 103 in the same plane can also be interconnected with each other or directly connected to each other through a connecting part. Similarly, this arrangement is also applicable to the gaps between groove walls 102, which will not be repeated here. Through the interconnections of each of the liquid guiding grooves 10, the liquid guiding component can be integrated, so that the practicability of the liquid guiding component can be increased. The aforesaid connecting part affects the separation distance between the two adjacent inlet ends 101 (or other portions of the liquid guiding groove), and the wider the connecting part is, the larger the aforesaid separation distance becomes.

In order to facilitate the placement and use of liquid guiding component, the aforesaid liquid guiding component may also include a support part for supporting the entire liquid guiding component, especially if the liquid guiding component is not connected to the print head of the printing device. The support part and the aforesaid connecting part can be both provided or alternatively provided according to the actual needs.

In the aforesaid embodiment, along the arrangement direction of the liquid guiding grooves 10, the shortest separation distance between the edges of every two adjacent liquid guiding grooves 10 is equal, and the shortest separation distance may be less than or equal to a preset distance, in some embodiments, the preset distance is 0~2 μm. There is no separation distance, or a small shortest separation distance between two adjacent liquid guiding grooves 10. When the inlet end 101 of the liquid guiding groove 10 is larger than the outlet end 103, the shortest separation distance between edges of the aforesaid liquid guiding grooves generally refers to the separation distance between the edges of every adjacent inlet ends 101, and the closer the separation distance, the relative larger the size of each of the inlet ends 101, so that the inkjet printing liquid can be better received, and can be better to achieve the alignment with the to-be-printed target substrate in actual use.

In some embodiments, the liquid guiding component is used in combination with the inkjet printing device, and the liquid guiding component is arranged below the nozzle orifices, with one to one correspondence. The size of the inlet end of the liquid guiding groove along the arrangement direction of nozzle orifice is smaller than the separation distance of nozzle orifices, which can make the ink ejected from each of nozzle orifices enter the corresponding liquid guiding grooves, and prevent the ink ejected from two adjacent nozzle orifices from entering the same nozzle orifice.

Figure 7:
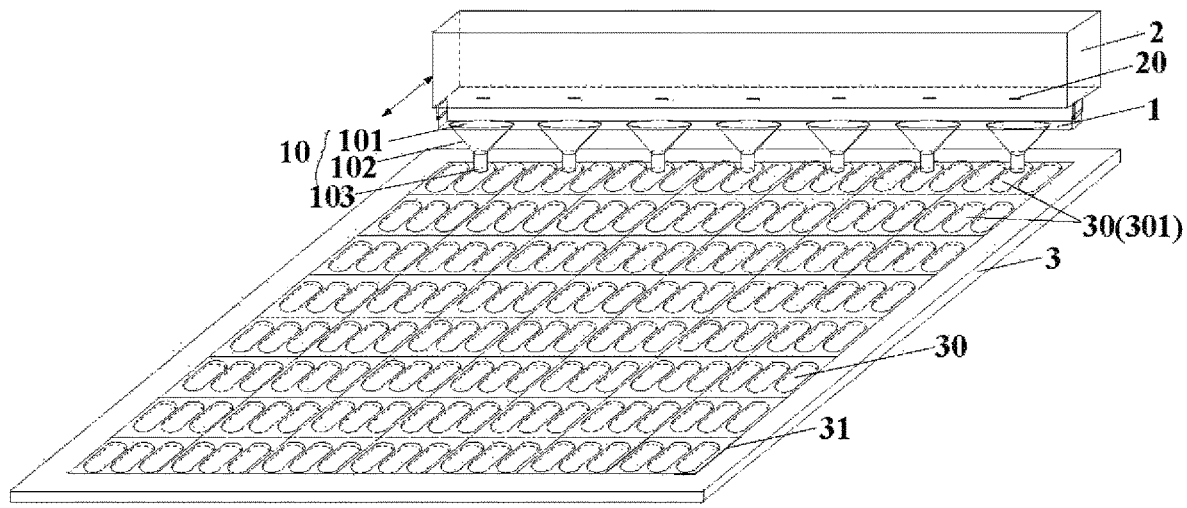
FIG. 7 shows a schematic diagram of using method of a further optional liquid guiding component provided by the present disclosure.
Figure 8:
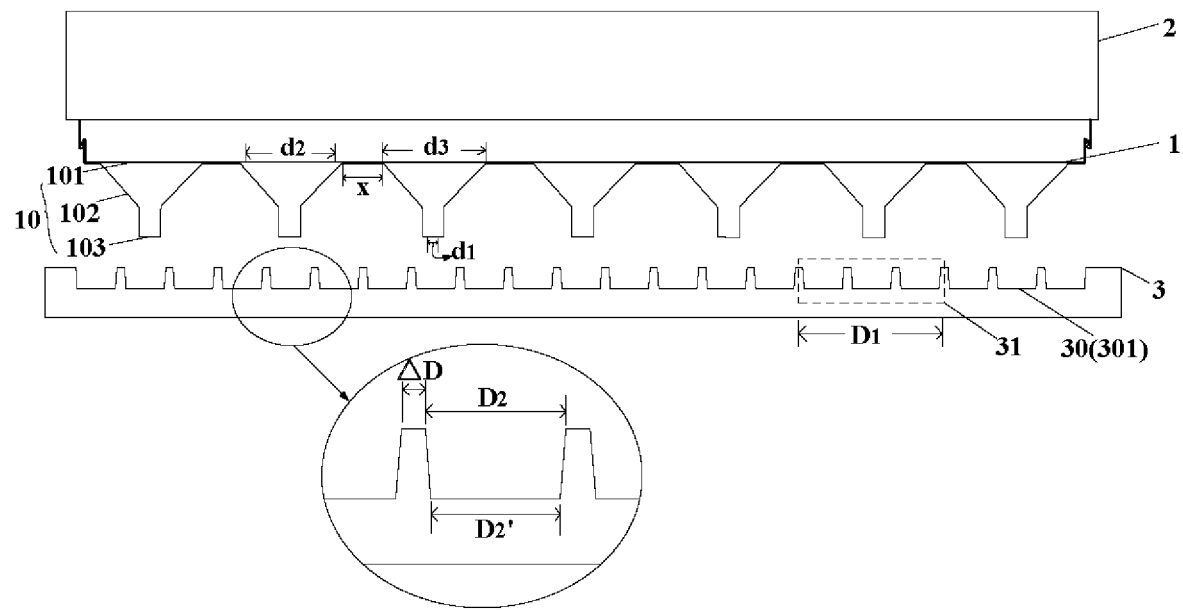
FIG. 8 shows a side view of using method of an optional liquid guiding component provided by the present disclosure.

The following is a brief description of a specific embodiment. As shown in FIG. 7 and FIG. 8, when the target substrate to be printed has a plurality of pixel units arranged in an array structure (pixel unit width is D1, the pixel unit can be 31 as shown in FIG. 7 and FIG. 8), and each pixel unit includes three sub-pixel pits (opening width of sub-pixel pit is D2, bottom surface width of sub-pixel pit is D2', D2>D2', and the sub-pixel pit can be 30 as shown in FIG. 7 and FIG. 8, the separation distance between the edges of the openings of the adjacent sub-pixel pits is ΔD, D1≥3*D2, ΔD≥0) the outlet end 103 of each liquid guiding groove 10 of the liquid guiding component (see FIG. 7 and FIG. 8) has an inner diameter d1, the inlet end 101 has an inner diameter d2, and the inlet end 101 has an outer diameter d3, if d1<d2<d3, the respective dimensions of the liquid guiding component can be as follows: 0<d1≤D2<d2<d3≤D1; the shortest separation distance x between the edges of two adjacent liquid guiding grooves 10 satisfies (2*D2+3ΔD)>x≥0, preferably x is close to or equal to 0, and under this condition, the inlet end of the liquid guiding component can be set larger, which is advantageous for receiving ink, and realizing the inlet end 101 of the liquid guiding groove 10 and the pixel unit arranged correspondingly, and the outlet end 103 and the sub-pixel pit arranged correspondingly.

It should be noted that the aforesaid width direction refers to the arrangement direction of each guiding groove 10, and the aforesaid inner diameter is applicable to the guiding grooves shown in FIG. 7 and FIG. 8.

Each of the aforesaid liquid guiding grooves 10 can be arranged in various forms. Generally, the arrangement form of the liquid guiding component can be specifically made according to the arrangement of nozzle orifice and the arrangement of the object to be printed. For example, if the object to be printed is a target substrate with a plurality of sub-pixel pits, then the arrangement of each liquid guiding groove 10 can be the same as that of each sub-pixel pit of the target substrate. In one or more of optional embodiments, each of the aforesaid liquid guiding grooves 10 is arranged in an array structure with a plurality of rows and columns, or a single row structure, or a single column structure, those arrangements are more regular and close to the conventional arrangement of pixels on the substrate, thereby improving the application scope of the liquid guiding component.

In some embodiments, the arrangement density of liquid guiding groove 10 is 30~300 grooves/inch, more preferably 100~300 grooves/inch. Liquid guiding grooves 10 arranged in such density can make the liquid guiding component applicable to the substrates to be printed which have a large arrangement density, or in other words, it can be applied to print substrate which corresponds to a display with a resolution of 30 ppi to 300 ppi.

In order to allow the liquid to be smoothly transported from the inner surface of the groove wall of the liquid guiding groove 10 to the outlet end 103 and reduce the resistance generated by the adsorption force of the inner surface to the liquid, in an optional embodiment, the surface energy of all or part of the inner surface of the groove wall 102 of the liquid guiding groove 10 is less than or equal to 20 dyn/cm, wherein part of the inner surface may be the portion of the inner surface that actually has transportation function on the liquid, and in some embodiments, the material forming the groove wall 102 or a film on the inner surface of the groove wall 102 includes one or more of a fluorine-containing compound or an organosilicone, and the film on the inner surface may satisfy the surface energy requirement when the material of the groove wall 102 does not satisfy the surface energy requirement.

In some embodiments, the inner surface of groove wall 102 of the liquid guiding groove 10 is a superhydrophobic surface. The superhydrophobic surface can be a surface that is both hydrophobic and oleophobic. Those skilled in the art can prepare the superhydrophobic surface by selecting a suitable material according to the properties of the inkjet liquid.

In order to improve the accuracy of the inlet end 101 of the liquid guiding component to receive the ejected liquid, and to raise the alignment accuracy between the outlet end 103 and the object to be printed, the aforesaid liquid guiding component may also be provided with an alignment mark for assisting alignment. In some embodiments, the liquid guiding component includes at least two alignment marks for better alignment.

Use of the liquid guiding component in the aforesaid embodiments of the present application can accurately control the movement direction of the ejected ink and improve the accuracy of the inkjet printing, thereby avoiding the phenomenon of printing deviation caused by external adverse effects on the ink out of the nozzle orifice, and solving the problem of cross contamination of light of adjacent pixels or pixel absence occurring in the display device produced by inkjet printing in the prior art, and achieving the effect of improving the printing accuracy of inkjet printing, in comparison with the existing inkjet technology in which the ink is directly ejected from the nozzle orifice.

Figure 5:
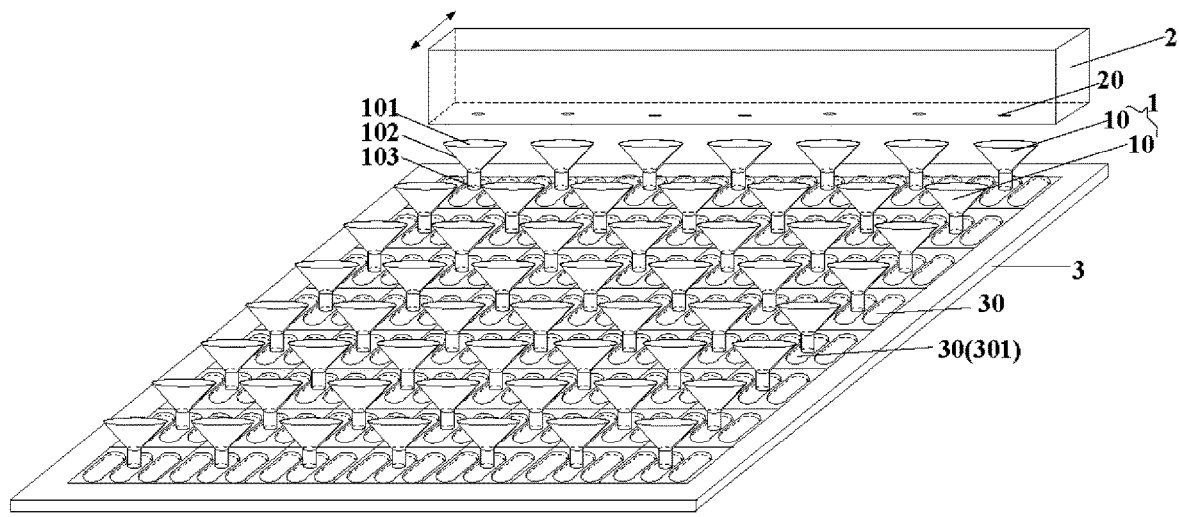
FIG. 5 shows a schematic diagram of using method of an optional liquid guiding component provided by the present disclosure.
Figure 6:
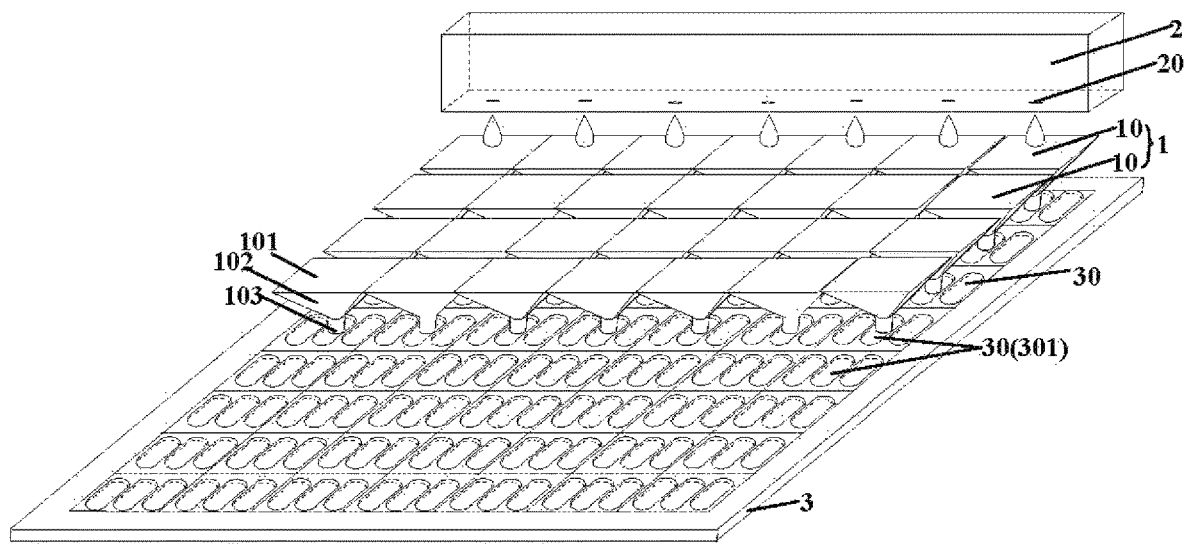
FIG. 6 shows a schematic diagram of using method of another optional liquid guiding component provided by the present disclosure.

According to another aspect of the present application, there is also provided a method of using a liquid guiding component, as shown in FIGS. 5 to 7, the liquid guiding component 1, the printing device 2 and the target substrate 3 to be printed are combined for inkjet printing; the liquid guiding component 1 is provided between the printing device 2 and the target substrate 3 to be printed, and the liquid guiding component 1 may be a liquid guiding component selected from any of the aforesaid embodiments, wherein the printing device 2 has a plurality of nozzle orifices 20, the liquid guiding component 1 is used for receiving ink ejected from the nozzle orifice 20 of the printing device through the inlet end 101 of the liquid guiding component 1, and discharging the ink from the outlet end 103 of the liquid guiding component 1 to the target substrate 3.

In the aforesaid embodiment, the liquid guiding component 1 may be connected with the printing device 2, such as detachably connection or no connection with the printing device 2. If not connected, in some embodiments, the aforesaid liquid guiding component 1 may further include a support part for supporting the liquid guiding component 1 so that the liquid guiding component 1 can be stably disposed above the target substrate 3 to be printed.

The liquid guiding grooves 10 of the liquid guiding component 1 can be arranged in a plurality of arrangement structures. The liquid guiding component 1 according to different arrangement structures can select different using methods, those methods can also be understood as the inkjet printing methods which apply the liquid guiding component 1.

By using the aforesaid liquid guiding component for inkjet printing, the plurality of liquid guiding grooves 10 of the liquid guiding component can allow liquid to enter into the inlet end 101 and then flow out from the outlet end 103, and the groove wall 102 connecting the inlet end 101 and the outlet end 103 can play the role of transporting the liquid, thus preventing the liquid from deviating from the direction of outlet end 103. The liquid guiding component can be used in the inkjet printing, and the aforesaid liquid can be ink ejected by inkjet printing process. Use of the liquid guiding component 1 can accurately control the movement direction of the ejected ink and improve the accuracy of the inkjet printing, thereby avoiding the phenomenon of printing deviation caused by external adverse effects on the ink out of the nozzle orifice and low precision of the printing device itself, thus solving the problem of cross contamination of light of adjacent pixels or pixel absence occurring in the display device produced by inkjet printing in the prior art, and achieving the effect of improving the printing accuracy of inkjet printing, in comparison with the existing inkjet technology in which the ink is directly ejected from the nozzle orifice.

Depending on the structures, shapes, and the like of the liquid guiding component 1, and the specifications and structures of the printing device 2 and the target substrate 3, and the using method of the liquid guiding component 1 can be divided into several cases for discussion, and the following is a brief introduction to the using method describing three optional cases in conjunction with FIGS. 5 to 7.

1. Optional Using Method in the First Case:

When the guiding groove 10 of the liquid guiding component 1 is arranged in an array structure with a plurality of rows and columns, in an optional embodiment, as shown in FIG. 5, the using method of the liquid guiding component 1 may include the following steps:

Step S101, preparing a printing device 2, a liquid guiding component 1 and a target substrate 3, wherein the target substrate 3 has a plurality of sub-pixel pits 30, and the print head of the printing device 2 includes a plurality of nozzle orifices 20, and each of nozzle orifices 20 is used for ejecting a first ink, and in some embodiments the plurality of nozzle orifices 20 are arranged in a single row structure or a single column structure (as shown in FIG. 5);

Step S103, disposing the liquid guiding component 1 above one side of the target substrate 3 having the sub-pixel pits 30, corresponding to the entire first target sub-pixel pits 301 or in other words, covering all of the first target substrate 3, so that the output ends 103 of the liquid guiding component 1 are aligned with the entire first target sub-pixel pits 301 of the target substrate 3 one by one, wherein the sub-pixel pits 30 include first target sub-pixel pits 301 and non-first target sub-pixel pits;

Wherein, a connecting part is disposed between each of the liquid guiding grooves 10, with the connecting part omitted and not shown in FIG. 5. The connecting part may be disposed between the open end of each liquid guiding groove as shown in FIG. 3. The space between each liquid guiding groove can be regarded as the connecting part, and the connecting part is not limited to the form shown in FIG. 3. The liquid guiding component further includes a support part, which is also not shown in FIG. 5, for supporting the entire liquid guiding component so as to be stably disposed above the target substrate.

Step S105, controlling the relative movement between the print head (of the printing device 2) and the liquid guiding component 1, meanwhile the liquid guiding component 1 and the target substrate 3 being kept relatively stationary to eject the first ink after moving each of nozzle orifices 20 of the print head above the respective inlet end 101 of the liquid guiding component and aligning it with the respective inlet end 101, so that the first ink enters the first target sub-pixel pits 301 via each of liquid guiding grooves 10 of the liquid guiding component 1.

The aforesaid first optional using method is mainly to place the liquid guiding component 1 with a plurality of rows and columns correspondingly on the first target sub-pixel pits 301 of the entire target substrate 3, that is, the liquid guiding component 1 covers the entire target substrate 3 at this time, and each of the outlet ends 103 corresponds to each of the first target sub-pixel pits 301. During the process of ink printing, the liquid guiding component 1 does not move relative to the target substrate 3, and the nozzle orifice 20 moves relative to the target substrate 3 and prints the ink into the first target sub-pixel pits 301.

2. Optional Using Method in the Second Case:

In the aforesaid optional embodiment, when the liquid guiding grooves 10 of the liquid guiding component 1 are arranged in an array structure of rows and columns, the aforesaid steps S101 to S105 are also performed. Unlike the first case, in the second case, when the liquid guiding component 1 covers a first part of the target substrate 3 instead of the entire target substrate 3, that is, the liquid guiding component 1 is disposed above one side having the sub-pixel pits 30 of the target substrate 3, corresponding to a partial quantities of first target sub-pixel pits 301. As shown in FIG. 6, after ejection of the first ink in Step S105, the using method in the second case may further include:

Step S107, repeating the disposing step (i.e., Step S103), so that the liquid guiding component 1 covers a second part of the target substrate 3, and each of the outlet ends 103 being aligned with the first target sub-pixel pit 301 of the second part of the target substrate 3 one by one, wherein the sub-pixel pit 30 including the first target sub-pixel pit 301, and repeating the step of controlling the movement (i.e., Step S105), so that the first ink enters each first target sub-pixel pit 301 of the second part of the target substrate 3, until the first ink enters each of the first target sub-pixel pits 301 of the entire target substrate 3.

In addition to the first part and the second part of the target substrate 3, the target substrate 3 can further include a third part, a fourth part, and the like. Under such conditions, the aforesaid using method can further include:

Repeating the disposing step, so that the liquid guiding component 1 covers a third part of the target substrate 3, and each of the outlet ends 103 being aligned with the first target sub-pixel pit 301 of the third part of the target substrate 3 one by one, and then, repeating the step of controlling the movement, so that the first ink enters each first target sub-pixel pit 301 of the third part of the target substrate 3, and the other parts of the target substrate 3 such as a fourth part are respectively printed in the same way, until the first ink enters each of the first target sub-pixel pits 301 of the entire target substrate 3.

The second optional using method is similar to the first case. Based on the first case in which the liquid guiding component 1 covers the first part of the target substrate 3 (as shown in FIG. 6, the liquid guiding component 1 can cover half of the target substrate 3), the second using method includes, the target substrate 3 and the liquid guiding component 1 being kept relatively stationary, moving the nozzle orifice 20 relative to the target substrate 3 and the liquid guiding component 1 so as to print the first ink into the first target sub-pixel pits 301 of the first part of target substrate 3, and then, moving the liquid guiding component 1 relative to the target substrate 3 so as to dispose it above the second part of the target substrate 3 to print in the same way after completion of printing of the first target sub-pixel pits 301 of the first part of target substrate 3; or replacing the old liquid guiding component 1 with a new liquid guiding component 1 and moving it onto another half of the target substrate 3, repeating the aforesaid steps until the first ink is printed into the whole first target sub-pixel pits 301 of the entire target substrate 3.

3. Optional Using Method in the Third Case:

As shown in FIG. 7, the outlet ends 103 of the liquid guiding component 1 are arranged in a single row structure or a single column structure. The using method may include:

Step S102, preparing a printing device 2, a liquid guiding component 1 and a target substrate 3, wherein the target substrate 3 having a plurality of sub-pixel pits 30, and the print head of the printing device 2 including a plurality of nozzle orifices 20 arranged in a single row structure or a single column structure, and each of nozzle orifices 20 being used for ejecting an ink, the ink comprising a first ink;

Step S104, adjusting the relative position of the liquid guiding component 1 and the print head (see the printing device 2 shown in FIG. 7), so that each of the inlet ends 101 is aligned with each of the nozzle orifices 20 one by one, in order to maintain the relative position of the liquid guiding component 1 and the nozzle orifices 20 unchanged, and in some embodiments, the liquid guiding component 1 being detachably connected with the print head of the printing device 2 (FIG. 7 and FIG. 8 showed the relative position of the liquid guiding component 1 and the print head, and the edge regions of the two are set correspondingly with detachable connection; as shown in FIG. 7 and FIG. 8, the two sides of the liquid guiding component 1 and the two sides of the printing device 2 are correspondingly buckled, with a portion of connectors each disposed on the liquid guiding component 1 and the printing device 2, but the connection method of the liquid guiding component 1 and the printing device 2 is not limited to the methods in FIG. 7 and FIG. 8; and those skilled in the art can select the connection method according to requirements, such as detachable adhesion, threaded connection, keyed connection, pinned connection, magnetic connection, etc., while the connectors may also individually belong to the liquid guiding component 1, or belong to the printing device 2, or the liquid guiding component 1 and the printing device 2 both have a portion of connectors).

Step S106, controlling the relative movement of the print head of the printing device 2 and the target substrate 3 while the liquid guiding component 1 being stationary relative to the print head of the printing device 2, ejecting a first ink when each of the nozzle orifices 20 and each of outlet ends 103 are disposed over the first target sub-pixel pits 301 and aligned with the first target sub-pixel pits 301, so that the first ink enters each of the first target sub-pixel pits 301 of the target substrate 3 via each of the liquid guiding grooves of the liquid guiding component 1 (may not contact the groove wall 102 or may contact the groove wall 102), wherein, the sub-pixel pits 30 include the first target sub-pixel pits 301.

The differences between third optional using method and the aforesaid two using methods are mainly as follows: the liquid guiding component 1 is in a single row or a single column, and the liquid guiding component 1 and the nozzle orifice 20 move together in synchronization, that is, the two are relatively stationary, while the two move relative to the target substrate 3 to complete the printing of the entire target substrate 3.

The using method of liquid guiding component is not limited to the aforesaid three forms. Those skilled in the art may combine or transform them into other using methods based on the aforesaid three using methods, the main spirit provided in this application, and the pixel design of color-emitting areas. These using methods are within the protection scope of the present application.

After printing of the first target sub-pixel pits 301 of the target substrate 3 according to the using method of the liquid guiding component in the aforesaid three cases is completed, since the first target sub-pixel pits 301 may be a part of the sub-pixel pits 30 of the target substrate 3, it may further include setting the other sub-pixel pits 30 as second target sub-pixel pits, in order to print all of the sub-pixel pits 30 of the target substrate 3.

In an optional embodiment, sub-pixel pits 30 comprises a plurality of sets of target sub-pixel pits, and each set of the target sub-pixel pits is arranged in the following structure: an array structure with a plurality of rows and columns, a single row structure or a single column structure. After printing a first ink in the first target sub-pixel pits 301, the aforesaid using method further includes: resetting a set of target sub-pixel pit to be printed as second target sub-pixel pits, replacing the first ink with a second ink which is different from the first ink, and replacing the liquid guiding component 1 with a new one which corresponds to the second ink, repeating the aforesaid steps of disposing and controlling, so that the second ink is transported through the liquid guiding component to the second target sub-pixel pits until each set of said target sub-pixel pits of said target substrate 3 is printed.

In the following example, a TFT substrate is as the printed target substrate 3 on which a light emitting layer of a light emitting device is fabricated, the target substrate 3 includes a plurality of pixel units 31 arranged in a matrix array (as shown in FIG. 7), and each of pixel units 31 includes three sub-pixel pits 30. The target of printing is to print three sub-pixel pits 30 in each pixel unit 31 so as to form sub-pixel pits 30 being capable of red, green and blue emission respectively. The target sub-pixel pits 301 can be classified into three types, red target sub-pixel pit (i.e., first target sub-pixel pit 301), green target sub-pixel pit (second target sub-pixel pit, with the specific position not shown in FIG. 7), and blue target sub-pixel pit (third target sub-pixel pit, with the specific position not shown not shown in FIG. 7).

First, the red ink (i.e., the first ink) may be printed into the red target sub-pixel pits (i.e., the first target sub-pixel pits 301), and the printing method may be adopted according to any of the aforesaid three cases.

Next, after all of the red target sub-pixel pits 301 of the target substrate 3 are printed with the red ink, the target sub-pixel pits are changed from the red target sub-pixel pits (i.e., the first target sub-pixel pits 301) to the green target sub-pixel pits (i.e., the second target sub-pixel pits), and the red ink (i.e., the first ink) is replaced with the green ink (i.e., the second ink) for the inkjet printing device, while the printing method may be adopted according to any of the aforesaid three cases to print the green target sub-pixel pits. When printing the green target sub-pixel pits, the liquid guiding component previously used for printing the red target sub-pixel pits can be used on the premise that the used liquid guiding component is cleaned and kept dry and it can match with the green target sub-pixels, or a new matched liquid guiding component can be directly replaced with for printing the green target sub-pixel pit;

Finally, after the green target sub-pixel pits 301 are printed, in the same manner, the second ink is replaced by the blue ink (i.e., the third ink), and the target sub-pixel pits 301 are changed to the blue target sub-pixel pits (i.e., the third target sub-pixel pits), and then using the original but cleaned liquid guiding component 1 or a new one for printing the blue target sub-pixel pits, after this printing, the printing of the sub-pixel pits 30 of the entire target substrate 3 is completed.

In an optional embodiment, as shown in FIG. 7, the surface on one side of the target substrate 3 has a plurality of pixel units 31, and each of the pixel units 31 includes a plurality of adjacent sub-pixel pits 30 in the same row or column. The orthographic projection of the inner edge line of each outlet end 103 of the liquid guiding component 1 on the target substrate may be located inside one target sub-pixel pit 30. For example, if the outlet end 103 is circle-shaped as shown in FIG. 7, the orthographic projection of the circular edge line corresponding to the interior of the outlet end 103 falls within the bottom surface of one target sub-pixel pit 30, or it can be said that the inner diameter of the outlet end 103 is smaller than the width of the target sub-pixel pit 30.

The orthographic projection of the outer edge line of each inlet end 101 of the liquid guiding component 1 on the target substrate may be located in one pixel unit 31. Similarly, for example, the orthographic projection of the outer circular edge line of the inlet end 101 as shown in FIG. 7 falls within the interior of one of pixel units 31, or it can be said that the outer diameter of the inlet end 101 is smaller than or equal to the width of one of pixel units 31. The pixel unit 31 includes a plurality of sub-pixel pits 30, which include three sub-pixel pits 30, as shown in FIG. 7. The aforesaid orthographic projection refers to the projection of an object on the substrate in a direction perpendicular to the plane where the substrate is located.

Through the aforesaid optional embodiments, the size of the liquid guiding component 1 and the sizes of the target sub-pixel pit and the pixel unit 31 can be matched, which is convenient for the disposition of the liquid guiding component 1, thereby improving the printing accuracy.

In the aforesaid using methods, the position of the liquid guiding component 1 provided between the printing device and the target substrate 3 also affects the effect of inkjet printing. In an optional embodiment, in order to allow the ejected ink to smoothly enter the target sub-pixel pit 301 when the ink is ejected to the target sub-pixel pit 301, the distance between each of the outlet ends 103 of the liquid guiding component 1 and the corresponding sub-pixel pit 30 may be controlled to be less than or equal to 1/n of the distance h between the nozzle and the sub-pixel pit (bottom surface), that is, less than or equal to h/n, wherein, n is an integer greater than 1. In some embodiments, n is greater than or equal to the number of all sub-pixel pits 30 in one pixel unit 31. In some embodiments, the distance between each of the outlet ends 103 of the liquid guiding component 1 and corresponding sub-pixel pit 30 may be controlled to be less than or equal to the product of h/n and the aperture ratio, and the aforesaid aperture ratio is a percentage of the area which has light passing of a single pixel unit to the total area of the pixel unit.

The distance between each of the outlet ends 103 and the corresponding sub-pixel pit 30 refers to the shortest distance between the outlet end 103 and the bottom surface of the corresponding sub-pixel pit 30 in the vertical direction (i.e., the direction perpendicular to the plane of the bottom surface of the sub-pixel pit). Those skilled in the art can set the aforesaid distance according to actual needs.

Through the aforesaid embodiments, each of the outlet ends is adjusted so as to be relatively close to the bottom surface of the sub-pixel pit 30 to facilitate the alignment of the two, and the closer of the two, the smaller probability that the deviation occurs after liquid flowing out of the outlet end 103. Thus, the aforesaid method of the present application also avoids the occurrence of cross contamination of light.

In some preferred embodiments, the distance between each of outlet ends 103 of the aforesaid liquid guiding component 1 and the corresponding sub-pixel pit 30 is greater than or equal to the height of the pixel isolation structure.

The height of the pixel isolation structure is the distance from the upper surface of the pixel isolation structure to the bottom surface of the sub-pixel pit 30; the height of the pixel isolation structure can be 1-5 µm, and the distance between each of the outlet ends 103 of the liquid guiding component 1 and the corresponding sub-pixel pits 30 is greater than the height of the pixel isolation structure, ensuring that the outlet end 103 does not easily hit the pixel isolation structure when the liquid guiding component is moving. In some embodiments, the distance between each of the outlet ends 103 of the liquid guiding component 1 and the corresponding sub-pixel pit 30 can be controlled to be less than or equal to 1 mm, reducing the effect of gravity during the ink droplet is falling.

The distance between each of the outlet ends 103 of the liquid guiding component 1 and the corresponding sub-pixel pit 30 is a predetermined distance, and those skilled in the art can set the distance according to actual needs.

In addition to adjusting the position relationship described above, it is also possible to simultaneously control the shortest distance between each of the inlet ends 101 of the liquid guiding component and each of the nozzle orifices 20 of the printing device to be greater than or equal to 0 and less than or equal to 1 mm, so that all of the ejected ink can fall into each of the liquid guiding grooves 10 of the liquid guiding component 1, and also can facilitate the alignment of the aforesaid nozzle orifice 20 and the inlet end 103 of the liquid guiding component. At this time, preferably, each of inlet ends is detachably connected with the nozzle orifice 20. For example, the edge portion of the liquid guiding component of the area where all the inlet ends are located may be detachably connected with the edge portion of the nozzle plate where the nozzle orifice 20 is located (as shown in FIG. 7 and FIG. 8), and the liquid such as the ink and the like ejected from the nozzle orifice 20 will directly enter the corresponding inlet end 101.

It should be noted that the connection method of the liquid guiding component 1 and the printing device 2 is not limited to the methods in FIG. 7 and FIG. 8 (the connection method is buckling), and those skilled in the art can select the connection method according to requirements, such as detachable adhesion, threaded connection, keyed connection, pinned connection, magnetic connection, etc. The connectors may also individually belong to the liquid guiding component 1, or belong to the printing device 2, or the liquid guiding component 1 and the printing device 2 may both have a portion of connectors);

The shortest distance between each of the inlet ends 101 and each of the nozzle orifices 20 of the printing device refers to the shortest distance in the vertical direction (i.e., the direction perpendicular to the plane where the nozzle orifice 20 is located), and the plane of the inlet ends 101 is parallel with the plane of the nozzle orifices 20, with the shortest distance between the two planes satisfying the aforesaid requirements. When the aforesaid shortest distance is 0, it can be understood that the two planes coincide.

In some preferred embodiments, the joint between two sides of the liquid guiding component and the printing device is further provided with a position adjusting member for adjusting the position relationship between the liquid guiding component and the printing device in multiple directions; in order to further improve the alignment accuracy of the liquid guiding component and each of the sub-pixel pits 30, the aforesaid using methods may comprise a process of aligning the inlet end 101 of the liquid guiding component 1 with the nozzle orifice 20 of the printing device, or a process of aligning the outlet end 103 of the liquid guiding component 1 with each of the sub-pixel pits 30 of the target substrate 3 to be printed, or a combination of the aforesaid two processes. In some embodiments, the process of aligning is achieved by disposing the alignment mark for the liquid guiding component, preferably the liquid guiding component includes two alignment marks.

According to another aspect of the present application, there is also provided an inkjet printing component, comprising: a print head and a liquid guiding component, wherein, the print head has a plurality of nozzle orifices 20, and in some embodiments the print head can include at least an ink tank, and a nozzle plate disposed under the ink tank, while the nozzle plate includes the aforesaid plurality of nozzle orifices 20; the inkjet printing component further includes the liquid guiding component selected from any of the aforesaid embodiments, the liquid guiding component including at least one liquid guiding groove disposed under the nozzle plate or the nozzle orifice 20, each of the liquid guiding grooves having at least one inlet end 101, at least one outlet end 103, and a groove wall 102 connecting the inlet end 101 and the outlet end 103, wherein, the inlet end 101 is disposed opposite to at least one of the nozzle orifices 20 as an inlet of ink ejected by the nozzle orifice 20, the outlet end 103 is disposed below the inlet end 101 as an outlet of the ink.

The aforesaid liquid guiding component is detachably connected with the print head or the nozzle plate of the print head, through means including adhesion or other detachable connection methods such as threaded connection, keyed connection, pinned connection, magnetic connection and the like. Thus, the liquid guiding component can move synchronously with the print head, so that the ink ejected from the nozzle orifice 20 of the print head can directly enter the inlet end of the liquid guiding component, and then flow out of the outlet end of the liquid guiding component, while the groove wall connecting the inlet end and the outlet end can function as transporting liquid and preventing the liquid flow direction from deviating away from the direction of outlet end.

Use of the inkjet printing component including the liquid guiding component can accurately control the movement direction of the ejected ink and improve the accuracy of the inkjet printing, thereby avoiding the phenomenon of printing deviation caused by external adverse effects on the ink out of the nozzle orifice 20 and low precision of the printing device itself, thus solving the problem of cross contamination of light of adjacent pixels or pixel absence occurring in the display device produced by inkjet printing in the prior art, and achieving the effect of higher printing accuracy of inkjet printing, in comparison with the existing inkjet technology in which the ink is directly ejected from the nozzle orifice 20.

The liquid guiding grooves 10 in the liquid guiding component in the aforesaid inkjet printing component may be arranged in various manners. For example, each of the liquid guiding grooves 10 in the plurality of the liquid guiding grooves 10 of the liquid guiding component may share an inlet end, as shown in FIG. 4. In some embodiments, each of the liquid guiding grooves 10 independently includes one of inlet ends 101 and one of outlet ends 103, and each of inlet ends 101 corresponds to each of outlet ends 103 one by one. In some embodiments, each of nozzle orifices 20 and each inlet end 101 are aligned with the top and bottom, such arrangement facilitates the alignment of the liquid guiding component 1 and the nozzle orifice 20, as well as ease of production and use.

According to another aspect of the present application, there is also provided an inkjet printing device comprising the inkjet printing component according to any of the aforesaid embodiments.

Since the inkjet printing device includes the aforesaid inkjet printing component, the alignment accuracy printing can be improved, the printing deviation can be reduced, thereby avoiding the external influence on the preset movement trajectory of the ejected ink, and achieving the improved printing performance of the inkjet printing device.

According to still another aspect of the present application, there is also provided an inkjet printing system comprising an inkjet printing device according to any of the aforesaid embodiments and a target substrate to be printed.

In an optional embodiment, the inkjet printing device can also include a motion unit that makes the inkjet printing component and the target substrate move relative to each other. The nozzle orifices can be moving or still relative to the liquid guiding component in the inkjet printing device. This allows the inkjet printing system to have a variety of feasible printing methods during printing process.

In the aforesaid printing system, the inkjet printing device includes a liquid guiding component 1, which can be connected or not connected with the print head, and then the target substrate 3 is disposed under the liquid guiding component 1, the ink ejected from the nozzle orifice of the print head directly enters the inlet end 101 of the liquid guiding component 1, and then the ink flows out of the outlet end 103 of the liquid guiding component 1, and finally the ink flows to the corresponding position of the target substrate 3, while the groove wall 102 connecting the inlet end 101 and the outlet end 103 can function to transport liquid to prevent the liquid flow direction from deviating away from the direction of the outlet end.

Use of the aforesaid inkjet printing system can accurately control the movement direction of the ejected ink and improve the accuracy of the inkjet printing, thereby avoiding the phenomenon of printing deviation caused by external adverse effects on the ink out of the nozzle orifice and low precision of the printing device itself, thus solving the problem of cross contamination of light of adjacent pixels or pixel absence occurring in the display device produced by inkjet printing in the prior art, and achieving the effect of improving the printing accuracy of inkjet printing, in comparison with the existing inkjet technology in which the ink is directly ejected from the nozzle orifice.

According to still another aspect of the present application, there is also provided an optoelectronic device comprising one or more of film layers, at least one film layer being prepared in accordance with the using method of the liquid guiding component according to any of the aforesaid embodiments. The aforesaid optoelectronic device may include a solar cell, an electroluminescent device, a single photon source, and the like.

Since the liquid guiding component is used to transport or guide the ejected ink during the film layer preparation by the using method of the aforesaid liquid guiding component (the ink may be in contact with the liquid guiding component or may not be in contact with the inner surface of the liquid guiding component), ensuring the movement according to a preset trajectory, reducing or eliminating the influences of other external factors, improving the printing accuracy of inkjet printing, avoiding the problem of cross contamination of light or pixel absence caused by the printing deviation, keeping the prepared film layer uniform, and enhancing the production yield, so that the overall luminous uniformity of the finally produced optoelectronic device including at least one film layer is good.

According to still another aspect of the present application, there is also provided an optical device comprising one or more film layers, at least one film layer being prepared in accordance with the using method of the liquid guiding component according to any of the aforesaid embodiments. The aforesaid optical device may include a quantum dot color filter or include aforesaid quantum dot color filter and a LED, and the like.

Through the aforesaid embodiments, the film layer in the optical device is prepared based on the using method of the aforesaid liquid guiding component, and the overall uniformity of each film layer is good, and there will be no partial film layer absence or cross contamination of light between adjacent film layers. Thus, the optical device including the film layer may have a pure light color and a uniform illumination.

According to yet another aspect of the present application, there is also provided a display, the display comprising the aforesaid optoelectronic device, and the optoelectronic device being an electroluminescent diode, or the display comprising the aforesaid optical device.

In the aforesaid embodiments, the display including such optoelectronic device as electroluminescent diode does not require backlight, has the features of low power consumption and fast response, being light and thin, and moreover, due to good illumination uniformity of optoelectronic device, the display has better display performance, higher color gamut, higher brightness and better uniformity; the display device including the aforesaid optical device has a good display performance due to the pure color and uniform illumination of the optical device.

The foregoing descriptions are merely preferred embodiments of the present disclosure and are not intended to limit the present disclosure, and for those skilled in the art, the present disclosure may have various changes and modifications. Any modification, equivalent replacement, and improvement made in the spirit and principle of the present disclosure shall fall within the protection scope of the present disclosure.

What is claimed is:

1. A liquid guiding component, comprising: a plurality of liquid guiding grooves, each of said liquid guiding grooves comprising at least one inlet end, at least one outlet end, as well as a groove wall connecting said inlet end and said outlet end, wherein, said liquid guiding component comprising a first side and a second side arranged opposite to each other, each of said inlet ends is arranged as liquid inlet on the first side and each of said outlet ends is arranged as the liquid outlet on the second side, and said liquid guiding groove is used to transport liquid from said inlet end to said outlet end, wherein said groove wall comprises an inner surface, said inner surface comprising at least one section of downhill surface, said downhill surface being an inclined surface, wherein the shortest distance between edges of two adjacent said liquid guiding grooves along the arrangement direction of said liquid guiding grooves is less than or equal to a preset distance, said preset distance is 0~2 microns, said liquid guiding component is used in combination with an inkjet printing device, and said inkjet printing device has a plurality of nozzle orifices, said liquid guiding component is arranged below said nozzle orifices, said plurality of liquid guiding grooves are in one to one correspondence with said plurality of nozzle orifices, a size of said inlet end of said liquid guiding groove along an arrangement direction of said nozzle orifices is smaller than a separation distance of said nozzle orifices.

2. The liquid guiding component according to claim 1, wherein said inner surface is a concave inner surface.

3. The liquid guiding component according to claim 1, wherein
said inner surface is a wrap-around surface, said inlet end and said outlet end respectively forming an opening of inlet end and an opening of outlet end, said inner surface connecting said opening of inlet end and said opening of outlet end, the area of said opening of inlet end being greater than the area of said opening of outlet end.

4. The liquid guiding component according to claim 3, wherein said inner surface of said groove walls near said outlet end further comprises at least one section of vertical surface.

5. The liquid guiding component according to claim 1, wherein said inlet ends of each of said liquid guiding grooves are located in the same plane.

6. The liquid guiding component according to claim 1, wherein each of said liquid guiding grooves is arranged in an array structure of rows and columns or a single row structure or a single column structure.

7. The liquid guiding component according to claim 6, wherein an arrangement density of said liquid guiding grooves is 30~300 grooves per inch.

8. The liquid guiding component according to claim 1, wherein the surface energy of all or part of said inner surface of said groove walls is less than or equal to 20 dyn/cm.

9. The liquid guiding component according to claim 1, wherein said inner surface of said groove walls is a super-hydrophobic surface.

10. The liquid guiding component according to claim 1, wherein said liquid guiding component is provided with an alignment mark.

11. A using method of a liquid guiding component, wherein said liquid guiding component, a printing device and a target substrate to be printed are combined for inkjet printing, said liquid guiding component is configured between said printing device and said target substrate to be printed, said liquid guiding component being the liquid guiding component according to claim 1, wherein, said printing device has a plurality of nozzle orifices, and said liquid guiding component is used to receive ink ejected from said nozzle orifices through the inlet end, while said ink is discharged from the outlet end to said target substrate.

12. The using method according to claim 11, wherein the liquid guiding grooves of said liquid guiding component are arranged in an array structure of rows and columns, and said using method comprises:
preparing said printing device, said liquid guiding component and said target substrate, wherein, said target substrate has a plurality of sub-pixel pits, and preferably, a plurality of said nozzle orifices are arranged in a single row structure or a single column structure;
disposing said liquid guiding component above one side having said sub-pixel pits of said target substrate, said liquid guiding component covering a first part of or entire target substrate so that each of said outlet ends is aligned with each of first target sub-pixel pits of said target substrate one by one;
controlling the relative movement between a print head and said liquid guiding component while said liquid guiding component is stationary relative to said target substrate, ejecting a first ink when each of said nozzle orifices passes over a corresponding one of said inlet ends, said first ink entering said first target sub-pixel pits via each of said liquid guiding grooves.

13. The using method according to claim 12, wherein when said liquid guiding component covers the first part of said target substrate, after said first ink is printed into said first target sub-pixel pits, said using method further comprises:
disposing said liquid guiding component above the side having said sub-pixel pits of said target substrate, said liquid guiding component covering a second part of said target substrate so that each of said outlet ends (103) is aligned with each of the first target sub-pixel pits of a second part of said target substrate one by one, and repeating said step of controlling the movement to make said first ink enter said first target sub-pixel pits.

14. The using method according to claim 11, wherein each of said outlet ends is arranged in a single row structure or a single column structure, and said using method comprises:
preparing said printing device, said liquid guiding component and said target substrate, wherein, said target substrate has a plurality of sub-pixel pits, and a plurality of said nozzle orifices are arranged in a single row structure or a single column structure;
adjusting the relative position of said liquid guiding component and a print head, so that each of said inlet ends is aligned with each of said nozzle orifices one by one;
controlling the relative movement between said print head and said target substrate while said liquid guiding component is stationary relative to said print head, ejecting a first ink when each of the outlet ends passes over a corresponding first target sub-pixel pit, the first ink entering each of said first target sub-pixel pits via each of said liquid guiding grooves.

15. The using method according to claim 12, wherein the surface of one side of said target substrate has a plurality of pixel units, each of said pixel units comprising a plurality of adjacent said sub-pixel pits in the same row or the same column, the orthographic projection of the inner edge line of each of outlet ends of said liquid guiding component on said target substrate being located in one target sub-pixel pit, the orthographic projection of the outer edge line of each of said inlet ends of said liquid guiding component on said target substrate being located in one of said pixel units.

16. The using method according to claim 12, wherein when said ink is ejected to said target sub-pixel pit, the distance between each of said outlet ends and corresponding said sub-pixel pit is controlled to be greater than or equal to the height of a pixel isolation structure.

17. An inkjet printing component, comprising:
a print head, said print head having a plurality of nozzle orifices, said print head comprising at least one ink tank and a nozzle plate arranged under said ink tank;
the liquid guiding component according to claim 1, said liquid guiding component comprising at least one liquid guiding groove disposed under the nozzle plate, each of liquid guiding grooves having at least one inlet end, at least one outlet end, and a groove wall connecting said inlet end and said outlet end, wherein, said inlet end is disposed opposite to at least one of said nozzle orifices as an inlet of ink ejected by said nozzle orifice, said outlet end is disposed below said inlet end as an outlet of said ink.

18. The inkjet printing component according to claim 17, wherein said liquid guiding grooves are plural, each of said liquid guiding grooves independently comprising one of said inlet ends and one of said outlet ends, with each of said inlet ends corresponding to each of said outlet ends one by one.

* * * * *